US007100141B1

(12) United States Patent
Ratchev et al.

(10) Patent No.: US 7,100,141 B1
(45) Date of Patent: Aug. 29, 2006

(54) TECHNOLOGY MAPPING TECHNIQUE FOR FRACTURABLE LOGIC ELEMENTS

(75) Inventors: Boris Ratchev, Sunnyvale, CA (US); Yean-Yow Hwang, Palo Alto, CA (US); Bruce Pedersen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 321 days.

(21) Appl. No.: 10/745,913

(22) Filed: Dec. 23, 2003

(51) Int. Cl.
*G06F 17/50* (2006.01)

(52) U.S. Cl. ............................ 716/16; 716/17; 716/18; 716/7

(58) Field of Classification Search ................ 716/16, 716/17, 18, 7
See application file for complete search history.

(56) References Cited

U.S. PATENT DOCUMENTS

| | | | | |
|---|---|---|---|---|
| 5,119,313 A * | 6/1992 | Shaw et al. ..................... 716/8 |
| 5,150,309 A * | 9/1992 | Shaw et al. ..................... 716/8 |
| 5,521,835 A * | 5/1996 | Trimberger ................... 716/17 |
| 5,594,657 A | 1/1997 | Cantone et al. |
| 5,610,829 A * | 3/1997 | Trimberger ................... 716/16 |
| 5,648,912 A * | 7/1997 | Narayanan et al. ........... 716/18 |
| 5,754,824 A | 5/1998 | Damiano et al. |
| 5,926,803 A | 7/1999 | Kitano |
| 6,195,788 B1 * | 2/2001 | Leaver et al. ................. 716/18 |
| 6,212,670 B1 | 4/2001 | Kaviani |
| 6,311,316 B1 * | 10/2001 | Huggins et al. ............... 716/12 |
| 6,321,366 B1 * | 11/2001 | Tseng et al. ..................... 716/6 |
| 6,389,379 B1 * | 5/2002 | Lin et al. ....................... 703/14 |
| 6,415,425 B1 * | 7/2002 | Chaudhary et al. ............. 716/9 |
| 6,519,755 B1 | 2/2003 | Anderson |
| 6,590,415 B1 | 7/2003 | Agrawal et al. |
| 6,651,225 B1 * | 11/2003 | Lin et al. ....................... 716/4 |
| 6,760,899 B1 * | 7/2004 | Young et al. ................. 716/16 |
| 6,785,873 B1 * | 8/2004 | Tseng ............................ 716/4 |
| 6,851,101 B1 * | 2/2005 | Kong et al. ................... 716/12 |
| 6,952,816 B1 * | 10/2005 | Gupta et al. .................. 716/18 |
| 2003/0200520 A1 * | 10/2003 | Huggins et al. .............. 716/16 |
| 2004/0210857 A1 * | 10/2004 | Srinivasan ..................... 716/2 |
| 2005/0039155 A1 * | 2/2005 | New ........................... 716/16 |
| 2005/0091630 A1 * | 4/2005 | Madurawe .................... 716/16 |

OTHER PUBLICATIONS

Lu et al., "Tradeoff Literals Against Support for Logic Synthesis of LUT-based FPGAs", IEE Proceedings of Computers and Digital Techniques, vol. 143, No. 2, Mar. 1996, pp. 111-119.*

(Continued)

*Primary Examiner*—Phallaka Kik
(74) *Attorney, Agent, or Firm*—Townsend and Townsend and Crew LLP

(57) ABSTRACT

A technique of minimizes circuit area on programmable logic with fracturable logic elements by using "balancing" in the technology mapping stage of the programmable logic computer-aided-design flow. A fracturable LE can be used for logic implementation in many ways, such as being used as one maximum-sized look-up table (LUT) or multiple smaller LUTs. One of more inputs of the multiple smaller LUTs may be shared. By balancing, this means mean that the technology mapping algorithm is tuned to use more small LUTs and fewer maximum-sized LUTs to implement the circuit. Although this is counterintuitive since the larger LUTs are more effective at absorbing gates, the technique achieves a smaller final circuit area by packing small LUTs into fracturable LEs.

22 Claims, 11 Drawing Sheets

OTHER PUBLICATIONS

Cong et al., "Boolean Matchnig for LUT-based Logic Blocks with Applications to Architecture Evaluation and Technology Mapping", IEEE Transactions on Computer-Aided Design of Integrated Circuits and Systems, vol. 20, No. 9, Sep. 2001, pp. 1077-1090.* de Lima et al., "A Tool for Analysis of Universal Logic Gates Functionality", Proceedings of XII Symposium on Integrated Circuits and Systems, Sep. 29, 1999, pp. 184-187.*

Murgai et al., "Cube-packing and Two-level Minimization", IEEE/ACM International Conference on Computer-Aided Design, Nov. 7, 1993, pp. 115-122.*

Reese et al., "A Coarse-Grain Phased Logic CPU", Proceedings of Nineth International Symposium on Asynchronous Circuits and Systems, May 12, 2003, pp. 2-13.*

Chaddha et al., "Constrained and Recursive Hierarchical Table-Lookup Vector Quantization", Proceedings of Data Compression Conference, Mar. 31, 1996, pp. 220-229.*

Cong, J. et al., "FlowMap: An Optimal technology mapping algorithm for delay optimization in lookup-table based FPGA designs," IEEE Trans. Computer-Aided Design, vol. 13, pp. 1-12, Jan. 1994.

Cong, J. et al., "Simultaneous depth and area minimization in LUT-based FPGA mapping," Proc. ACM 3rd Int. Symp. FPGA, pp. 68-74, Feb. 1995.

Francis, R.J. et al., "Chortle-crf: Fast technology mapping for lookup table-based FPGA's," Proc. 28th ACM/IEEE Design Automation Conf., 1991, pp. 613-619.

Murgai, R. et al., "Improved logic synthesis algorithms for table loop up architectures," Proc. IEEE Int. Conf. Computer-Aided Design, Nov. 1991, pp. 564-567.

Farrahi, A. et al., "Complexity of the lookup-table minimization problem for FPGA technology mapping," IEEE Trans. Computer-Aided Design, vol. 13, pp. 1319-1332, Nov. 1994.

Cong, J. et al., "Combinational logic synthesis for LUT based field programmable gate arrays," ACM Trans. Des. Auto., Electron Syst., vol. 1, No. 2, pp. 145-204, 1996.

Cong, J. et al., Beyond the combinatorial limit in depth minimization for LUT-based FPGA designs,: Proc. IEEE Int. Conf., Computer-Aided Design, Nov. 1993, pp. 110-114.

Chowdhary, A. et al., "General modeling and technology mapping technique for LUT-based FPGAs," Proc. 5th ACM/SIGDA Int. Symp. FPGAs, pp. 43-49, Feb. 1997.

* cited by examiner

TECHNOLOGY MAPPING TECHNIQUE FOR FRACTURABLE LOGIC ELEMENTS

BACKGROUND OF THE INVENTION

The present invention relates to the area of electronic design automation of logic designs and in particular, to an aspect known as technology mapping of a logic design, especially for a technology having fracturable logic elements.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded functionality such as user-programmable memory or RAM, digital signal processors (DSPs), and on-board microcontrollers such as ARM-based or MIPS-based controllers.

As integrated circuits become more complex and provide more functionality in a smaller die size, it also becomes increasing difficult to ensure the logic functions are implemented properly and in an optimal way. Modern digital integrated circuits have many transistors and many logic gates, more so than be optimized manually in a reasonable amount of time, especially when time-to-market is critical in ensuring a product's success. As a specific example, a typical programmable logic design surpasses the multimillion-gate mark.

Electronic design automation tools are available to assist engineers with the design and verification tasks. But even with the help of computer-aided tools, the process of optimizing an integrated circuit design can be time-consuming because of the large number of variables involved. It is desirable that the design automation task is done time efficiently even for large designs. Further, it is desirable the design automation tool maximizes performance or otherwise improves an aspect of an integrated circuit design. Some other aspects of a design that a tool may help with include improving critical path performance, removing metastability, reducing the number of logic gates used, checking or verifying functionality, removing race conditions, and others.

A programmable logic architecture may provide fracturable logic elements or logic blocks. These are logic elements which can be split-up or divided up into smaller units. For example, a fracturable architecture may have a logic element that is capable of being is configured as two four-input look-up tables, one eight-input look-up table, with shared inputs, or one six-input look-up table. A fracturable logic element allows for greater flexibility and higher utilization of the on-chip logic. Electronic design automation techniques should take advantage of the capabilities provided by an architecture with a fracturable logic element.

As can be appreciated, there is a need to provide an electronic design automation system and techniques to handle fracturable logic elements in programmable logic, in order to better utilize the on-chip logic.

BRIEF SUMMARY OF THE INVENTION

This invention provides a novel technique of minimizing circuit area on programmable logic with fracturable logic elements by using "balancing" in the technology mapping stage of the programmable logic computer-aided-design flow. A fracturable LE can be used for logic implementation in many ways, such as being used as one maximum-sized look-up table (LUT) or multiple smaller LUTs. By balancing, we mean that the technology mapping algorithm is tuned to use more small LUTs and fewer maximum-sized LUTs to implement the circuit. Although this is counterintuitive since the larger LUTs are more effective at absorbing gates, the technique achieves a smaller final circuit area by packing small LUTs into fracturable LEs. The balancing procedure can be carried out while keeping the logic depth of the circuit constant. This constant depth means that the speed or performance of the circuit remains does not deteriorate while we reduce its final area.

In a specific embodiment, the invention is a method including mapping a logical function into a logic block having a look-up table configurable as a first look-up table having X inputs or as two lookup tables, having Y and Z inputs respectively, where Y+Z is greater than X. The upper bound on Y+Z depends on the particular implementation and on how many inputs the Y and Z LUTs share, which is discussed further below. The method further includes determining a configuration for the logic block based upon a technology mapping cost function.

In an embodiment, X is 6, The cost function may include a Wa*A−Ws*S+Wp*P, where A is a cost measure of look-up table area, S is a measure of sharing possibility, and P is a measure of packing ability of the LUT. Wa, Ws and Wp are tuning coefficients.

In a specific embodiment, the invention is a method including providing a number of logic blocks having a look-up table configurable in a first configuration as a look-up table having at most X inputs or in a second configuration as one or more look-up tables, at least one of these look-up tables having at most Y inputs, wherein Y is less than X. A logic function is mapped into one of the number of logic blocks, where based on a first selected value for a coefficient in a cost function, the logic function is mapped into I look-up tables of the first configuration, where I is an integer 1 or greater. A logic function is mapped into one of the number of logic blocks, where based on a second selected value for the coefficient in a cost function, the logic function is mapped into J look-up tables of the second configuration, where J is an integer greater than I.

The cost function will sometimes show that it is more favorable for overall area reduction to map to LUTs with Y inputs than to LUTs with X inputs where Y is less than X. The Y-input LUTs can be packed together in a postprocessing step, which produces more optimal area results than if they had been mapped to the larger LUTs with X inputs.

The cost function is Wa*A−Ws*S+Wp*P, where A is a cost measure of look-up table area input, S is a measure of sharing possibility, P is a measure of the availability for packing, and Wa, Ws, and Wp are coefficients. In embodiments, Wp is 0, Wp is ½ of Wa, or Wp is 7.5*Wa. X may be 6, and Y, Z may be 1, 2, 3, 4, 5.

In a specific embodiment, the invention is a method including providing a number of logic blocks having a first configuration having a logic structure with at most X inputs and a second configuration with having a number of logic structures, at least one of the logic structure having at most Y inputs, where Y is less than X. A cost function is evaluated to obtain a first cost value when mapping a logic function using a logic block of the first configuration. The cost function is evaluated obtain a second cost value when mapping the logic function using a logic block of the second configuration. The logic function is mapped to a logic block having the first configuration if the first cost value is less than the second cost value.

The method may further include mapping the logic function to a logic block having the second configuration if the second cost value is less than the first cost value. The cost function may include a variable representing a packability value. The packability value represents how easy it is for the LUT to be packed with another LUT. For example in on embodiment a LUT with 6 inputs cannot be packed with any other LUT so it gets a value of 1 for P. A smaller LUT can be packed so it gets P=0—i.e., no addition to the cost. The cost function may include a variable representing a fan out value. The fanout value relates to the S term (a merit) in the cost function. The higher the fanout the more opportunities for input sharing. When evaluating a cost function to obtain a first cost value, this may include consulting a look-up table structure such as contained in a database to find a packability value corresponding to a logic structure having X inputs. When evaluating a cost function to obtain a first cost value further, this may include consulting a look-up table structure such as contained in a database to find an area value corresponding to a logic structure having X inputs.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
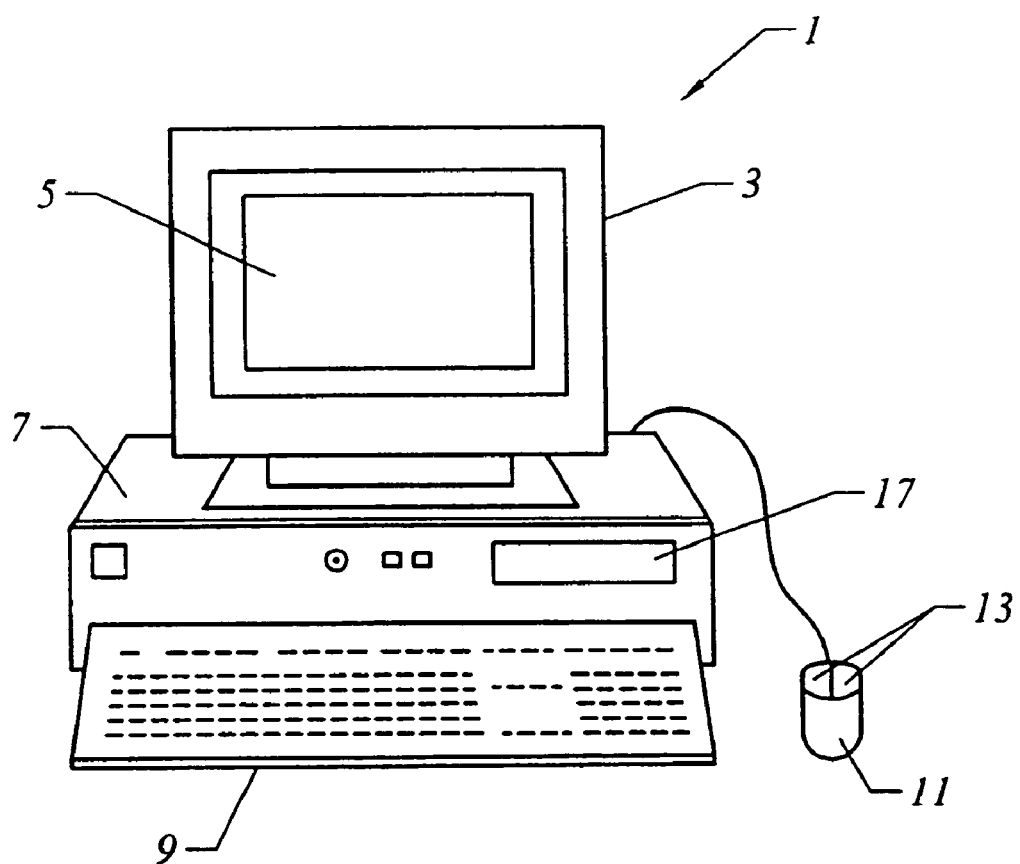
FIG. 1A shows an embodiment of a system of the invention.

FIG. 1A shows a system of the present invention for performing synthesis and place and route. In an embodiment, software of the invention executes on a computer workstation system, such as shown in FIG. 1A. FIG. 1A shows a computer system 1 that includes a monitor 3, screen 5, cabinet 7, keyboard 9, and mouse 11. Mouse 11 may have one or more buttons such as mouse buttons 13. Cabinet 07 houses familiar computer components, some of which are not shown, such as a processor, memory, mass storage devices 17, and the like. Mass storage devices 17 may include mass disk drives, floppy disks, Iomega ZIP™ disks, magnetic disks, fixed disks, hard disks, CD-ROMs, recordable CDs, DVDs, DVD-R, DVD-RW, Flash and other non-volatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, or CD-ROM).

Figure 1B:
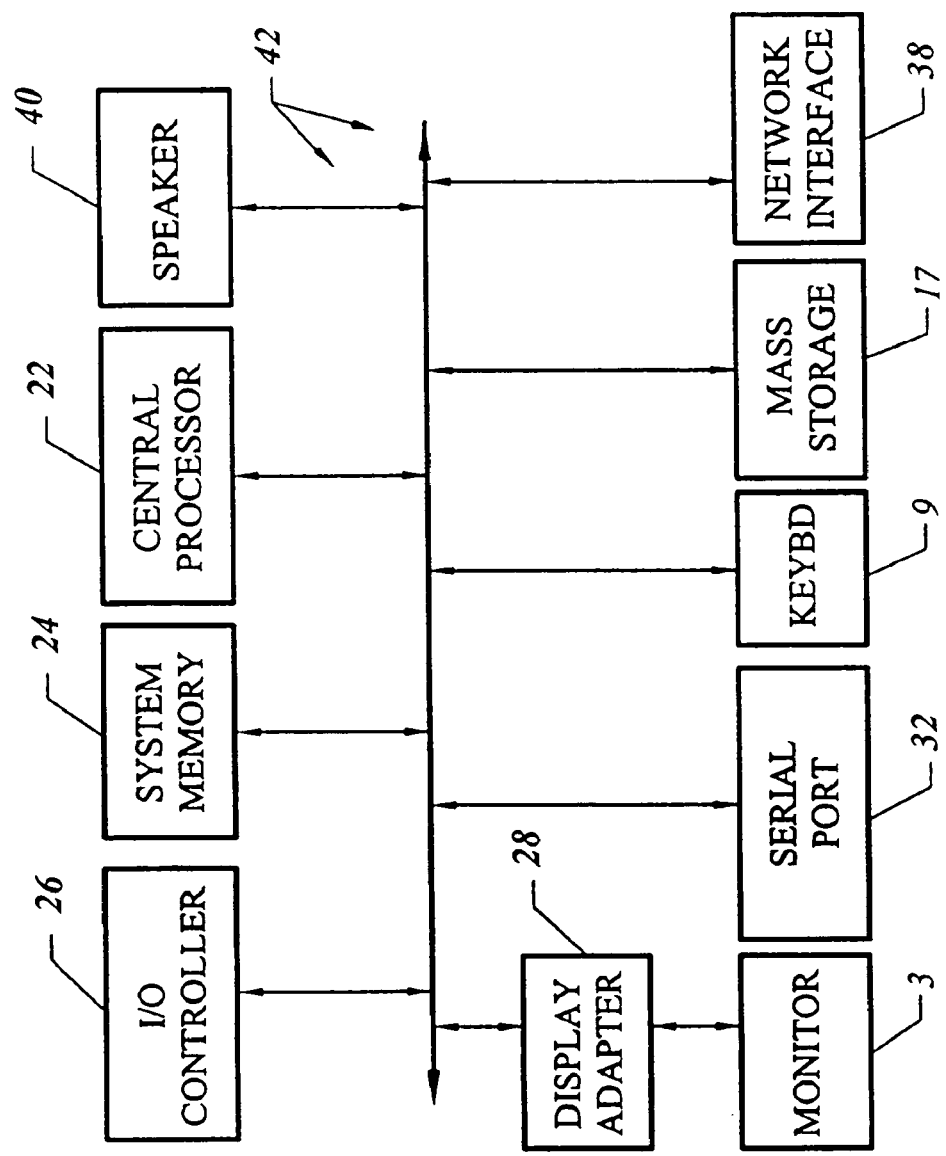
FIG. 1B shows a more detailed block diagram of the system of FIG. 1A.

Furthermore, FIG. 1B shows a system block diagram of computer system 1 used to execute the software of the present invention. As in FIG. 1A, computer system 1 includes monitor 3, keyboard 9, and mass storage devices 17. Computer system 1 further includes subsystems such as central processor 22, system memory 24, input/output (I/O) controller 26, display adapter 28, serial or universal serial bus (USB) port 32, network interface 38, and speaker 40. The invention may also be used with computer systems with additional or fewer subsystems. For example, a computer system could include more than one processor 22 (i.e., a multiprocessor system) or a system may include a cache memory.

Arrows such as 42 represent the system bus architecture of computer system 1. However, these arrows are illustrative of any interconnection scheme serving to link the subsystems. For example, speaker 40 could be connected to the other subsystems through a port or have an internal direct connection to central processor 22. Computer system 1 shown in FIG. 1A is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, www.mathworks.com), SAS, SPSS, and Java. The computer software product may be an independent application with data input and data display modules. Alternatively, the computer software products may be classes that may be instantiated as distributed objects. The computer software products may also be component software such as Java Beans (from Sun Microsystem), Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, pattern recognition may be performed via distributed computer through this network, where each computer in the network performs part of the task of the many series of pattern recognition steps in parallel. Furthermore, the network may be an intranet, internet, or the Internet, among others. The network may be a wired network (e.g., using copper), telephone network, packet network, an optical network, or a wireless network. For example, data and other information may be passed between the computer and components (or steps) of a system of the invention using a wireless network using a protocol such as Wi-Fi (IEEE standard 802.11, 802.11a, 802.11b, 802.11 g, and 802.11i to name a few examples). For example, signals from a computer may be transferred, at least in part, wirelessly to a programmable logic integrated circuit.

Figure 1C:
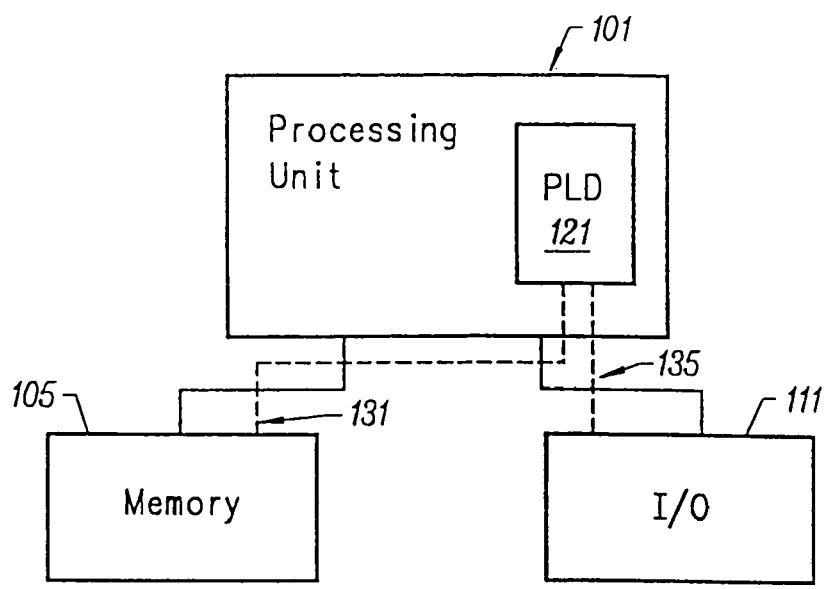
FIG. 1C is diagram of a digital system with a programmable logic integrated circuit.

FIG. 1C shows a block diagram of a digital system, which the system the invention may incorporate or operate on. The system may be provided on a single board, on multiple boards, or within multiple enclosures. Though embodiments of the present invention are useful in electronic and integrated circuits in general, they are particularly useful in programmable logic devices. FIG. 1C illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs and are sold, e.g., by Altera Corporation of San Jose, Calif. Programmable logic integrated circuits and their operation are well known to those of skill in the art.

In the particular embodiment of FIG. 1C, a processing unit 101 is coupled to a memory 105 and an I/O 111, and incorporates a programmable logic device 121. PLD 121 may be specially coupled to memory 105 through connection 131 and to I/0 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
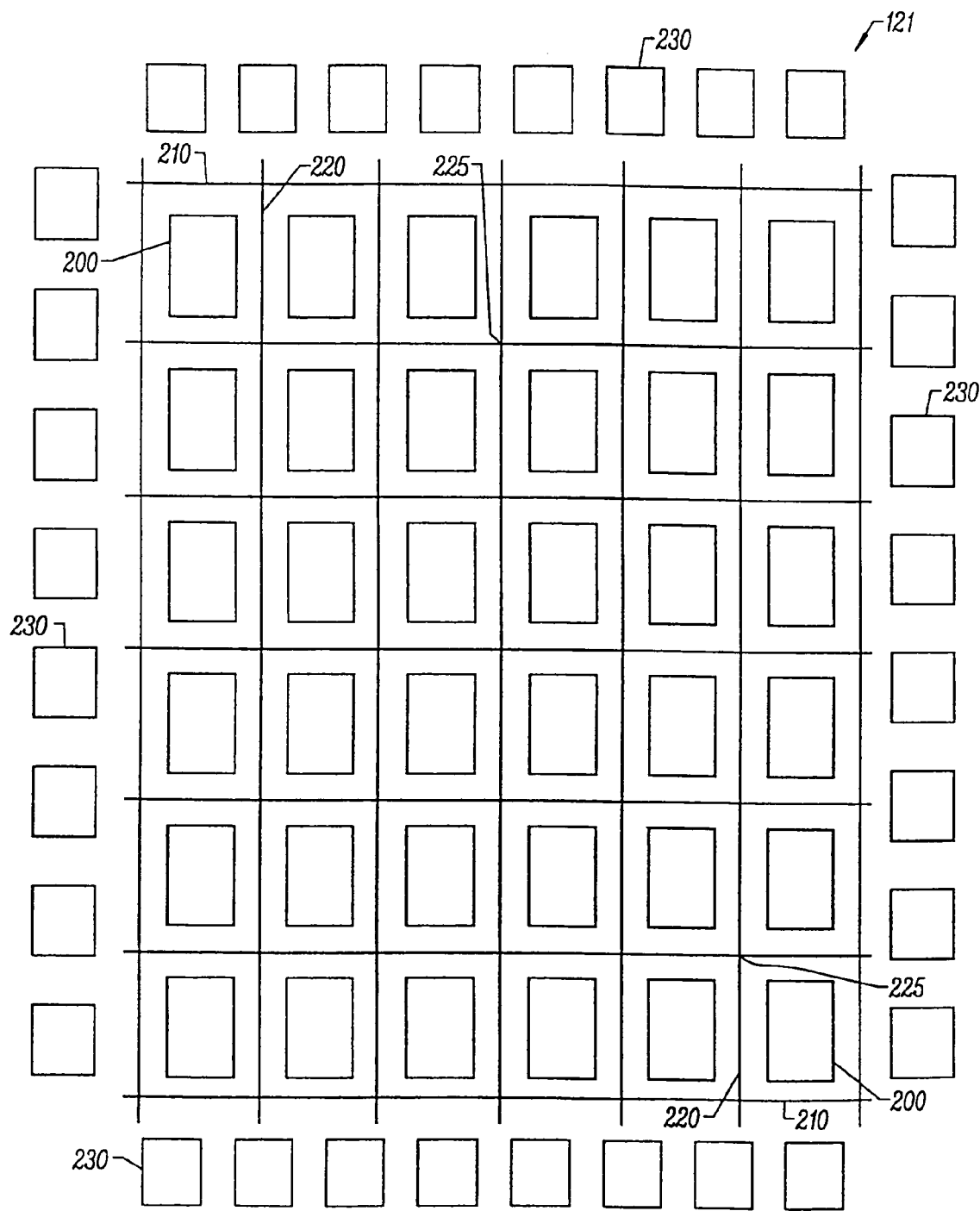
FIG. 2 is a diagram showing a floor plan of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, having an array of horizontal interconnects 210 and vertical interconnects 220. Although shown as single lines in FIG. 2, each set of interconnect lines may represent a number of signal conductors. The inputs and outputs of LAB 200 are programmably connectable to these sets of interconnect lines, such that multiple LABs 200 may be connected and combined to implement larger, more complex logic functions than can be realized using a single LAB 200.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
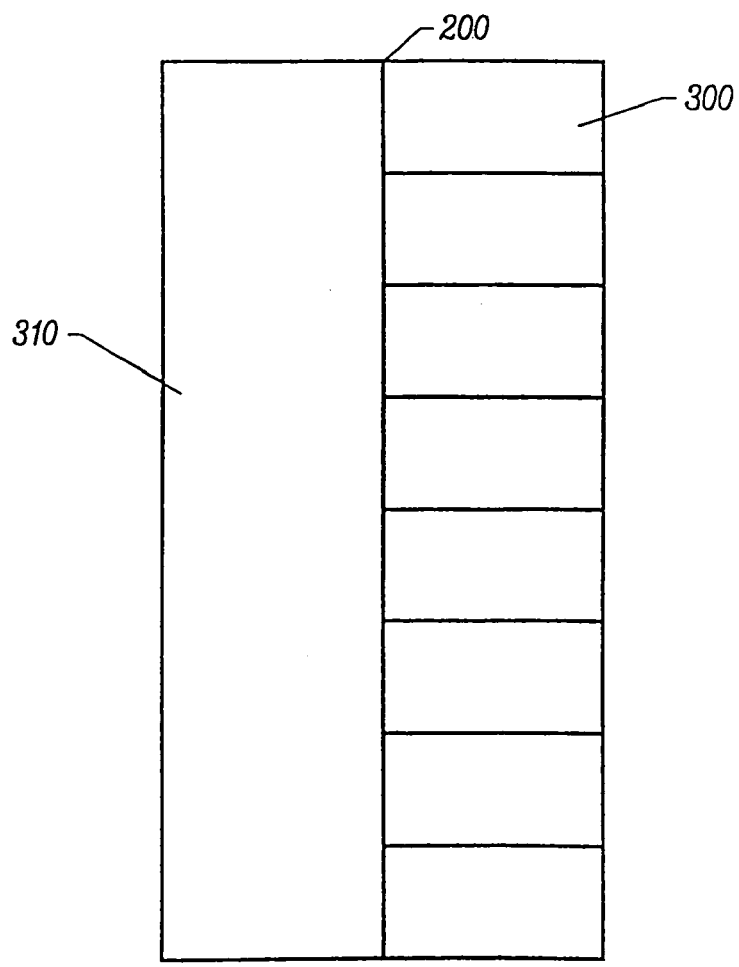
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells" or LCELLs, and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB are connectable to LE 300 through local interconnect structure 310. In one embodiment, LE 300 incorporates a function generator that is configurable to provide a logical function of a number of variables, such a four-variable Boolean operation. As well as combinatorial functions, LE 300 also provides support for sequential and registered functions using, for example, D flip-flops. For example, a logic element includes combinational and sequential blocks. The combinational blocks may be implemented using product terms or a look-up table (LUT), as a couple of examples. The sequential block may be a flip-flop, D flip-flop, or register.

A logic element may include one or more look-up tables. And the look-up tables may be fracturable, which means there may be a number of look-up tables that can be combined to form a larger look-up table, having more inputs. Logic elements and other logic block structures may also be fracturable. For example, multiplexers, logic gates, and other logic structures may be fracturable.

LE 300 provides combinatorial and registered outputs that are connectable to the interconnect lines 210 and 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure.

Figure 4:
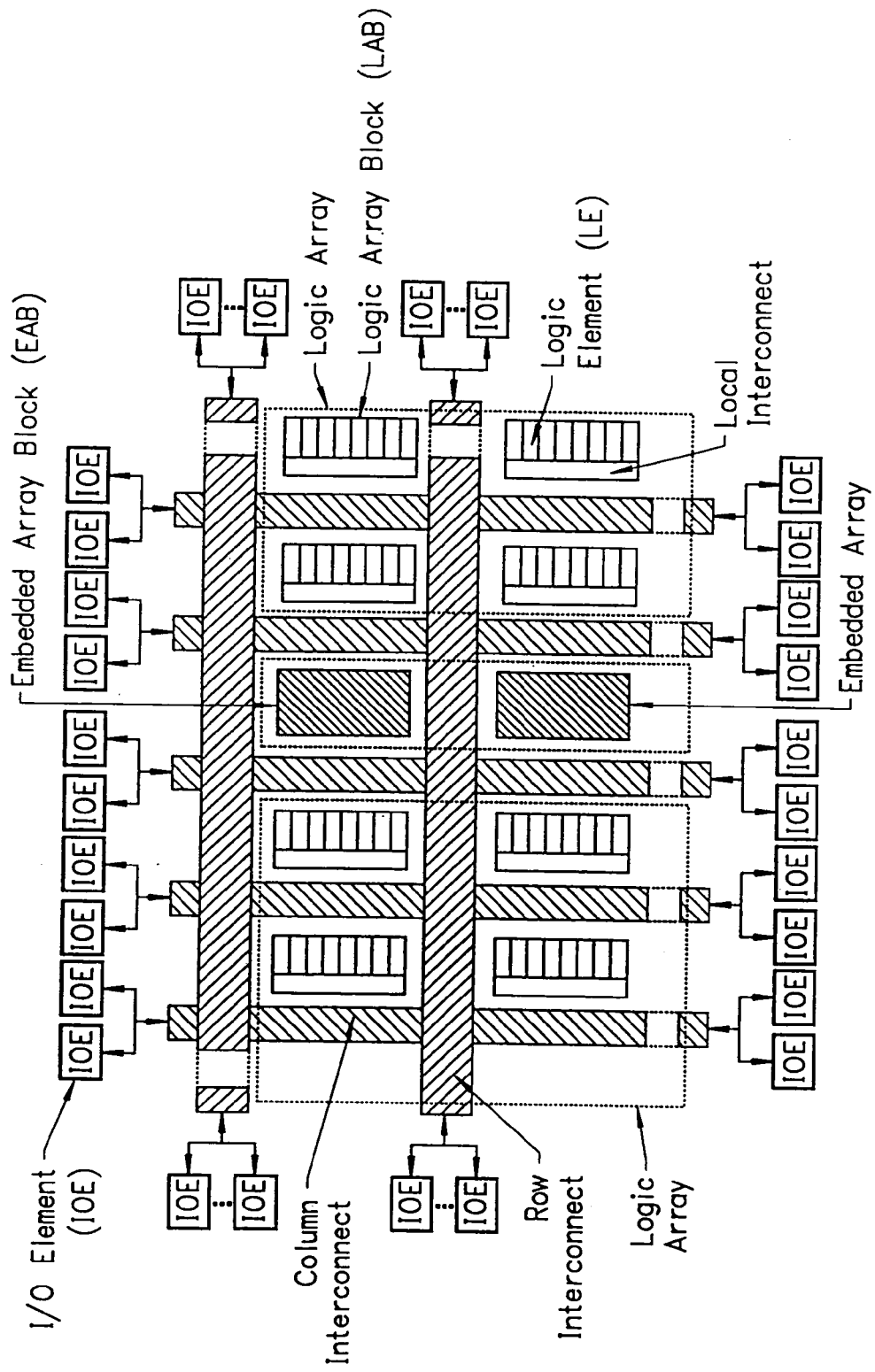
FIG. 4 is a diagram showing a programmable logic architecture with embedded array blocks (EABs) and logic array blocks (LABs).

FIG. 4 shows an example for a typical programmable logic architecture. The architecture in FIG. 4 further includes embedded array blocks (EABs). EABs contain user memory, a flexible block of RAM. The embedded array blocks can be configured as FIFOs acting as frequency translators and serial to parallel converters for interfacing between high-speed input and outputs and the core circuits including the logic array blocks.

Figure 5:
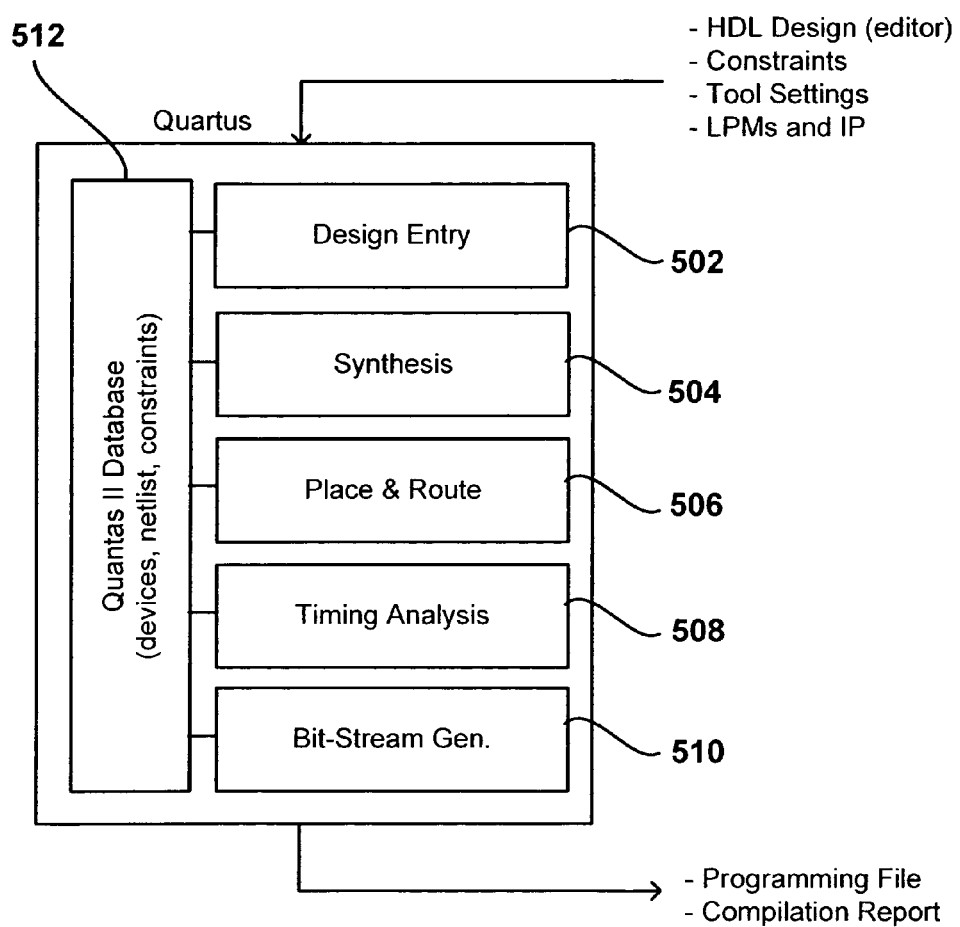
FIG. 5 shows an overall diagram of a computer-aided design (CAD) or electronic design automation (EDA) flow including synthesis.

FIG. 5 shows an example of a flow diagram of a electronic design automation (EDA) or computer-aided design (CAD) tool used in the design of integrated circuits including microprocessors, ASICS, memories, FPGAs, PLDs, and others. In a specific implementation, this flow is used to configure a programmable logic integrated circuit. As discussed above, a user typically programs a programmable logic integrated with the user's desired logic. FIG. 5 is an example of one technique of designing and implementing logic for a programmable logic integrated circuit. At Altera, a particular implementation of the technique of this flow is implemented using a software system referred to as Quartus. This is just an example. One could draw the flow with more or fewer steps and targeting a specific or more general device hardware. The most common implementation of this flow would be as a computer program executing as part of a system similar to that shown in FIG. 1, though other implementations are possible.

The steps of the flow include design entry 502, synthesis 504, place and route 506, timing analysis 508, and bit stream generation 510. Each of these steps in the process may access, store, or retrieve data from a database 512. The database may include devices, a netlist, and constraints.

Design entry is a step of a user specifying his design. Design entry may be performed by schematic capture, entering in logic gates and other logic symbols in a schematic editor. Other techniques of design entry include using a high level design language (HDL) editor. The design is input in a language such as VHDL or Verilog.

Synthesis is a process or method, typically implemented in a software program, for converting the input design from a high-level design language such as VHDL or Verilog into an optimized netlist of gates mapped into the target technology. In the case of programmable logic this often, but not always, includes 4-input lookup-tables (LUTs) and a D-type flip-flops (DFFs). There are many other details and differences not described here.

Synthesis can be either hard-coded as an algorithm, or controlled through a script. Though conceptually similar as a method of computation, the latter is common because it allows for more flexibility and also allows substitute scripts to be used as an option in the flow. The concept of a script for synthesis is largely due to the SIS synthesis system from Berkeley. For more information, see E. M. Sentovich, K. J. Singh, L. Lavagno, C. Moon, R. Murgai, A. Saldanha, H. Savoj, P. R. Stephan, R. K. Brayton, and A. L. Sangiovanni-Vincentelli, SIS: A System for Sequential Circuit Synthesis, Technical Report UCB/ERL M92/41, Electronics Research Lab, Univ. of California, Berkeley, Calif. 94720, May 1992.

There are many algorithms in synthesis. The following are some examples of algorithms that are available for calling in a typical synthesis system. A synthesis operation may be to remove redundant logic. Some techniques includes sweep, two-level minimizer, one-hot state machine minimizer, odc (observability don't care) stuck feedbacks, odc combinatorial logic, odc secondary signals, reduce secondary signals, convert silly LUTs to logic, and remove redundant loop cuts. A synthesis operation may include restructuring and removing redundant logic. Some techniques include resynthesizing fan-out-free cones and resynthesizing cones through fan out. A synthesis operation may include restructuring. Some techniques include eliminate, factor sum-of-products, decompose to two inputs, widen, make sum-of-products, and extract aload (i.e., asynchronous load) signals. A synthesis operation may include removing duplicate or redundant combinational logic or registers, extracting common cubes, or XORs. A synthesis step in a CAD flow may include any combination or all of these operations, and may include other operations too.

More specifically, the algorithms to remove redundant logic include: (1) Sweep: propagates constants through the netlist. (2) Two-level minimizer: minimizes the number of AND-gates in each sum-of products. (3) One-hot state minimizer: minimize logic in state machine making use of the knowledge of the possible and impossible states of the registers. (4) Odc stuck feedbacks: remove registers and combinational loops that are stuck at some specific value due to a feedback from their own output. (5) Odc combinatorial logic: observability don't care minimization that uses knowledge about when a gate value is not observable to minimize it. (6) Algorithms to reduce secondary signals: minimize secondary signals on registers. (7) Convert silly LUTs to logic: absorb more input logic in existing LUTs if possible. Convert LUTs of which not all inputs are used into simple combinatorial gates. (8) Remove redundant loop cuts: remove cut buffers that are not part of a combinatorial loop.

The algorithms to restructure logic include: (1) Eliminate: flatten logic into less levels. (2) Factor sum-of-products: apply algebraic factoring on a sum-of-products to add more levels of logic. (3) Decompose to two inputs: decompose each AND, OR and XOR gate with more than two inputs into a tree of gates each with two inputs. (4) Widen: flatten trees of the same type of gates w/o inverters into one gate with more inputs. (5) Make sum-of-products: change the logic so that it is built up of sum-of-products only (a sum-of-products is an OR gate fed by AND-gates only, such that there are no inverters between the AND and OR gates, and each AND gate fans out only to this OR gate). (6)

Extract aload signals: change registers to use asynchronous load instead of clear and preset.

The algorithms to restructure and remove redundant logic include: (1) Resynthesize fanout free cones: flatten fanout free cones into sum-of-products, call two-level minimizer and factoring algorithm on sum-of-products. (2) Resynthesize cone through fanout: flatten any cone into sum-of-products, call two-level minimizer and factoring algorithm on sum-of-products.

The algorithms to share duplicate logic: (1) Extract cubes: extract common AND gates from different AND gates in the netlist, and extract common OR gates from different OR gates in the netlist. (2) Extract common xors: extract common XOR gates from different XOR gates in the netlist. (3) Remove duplicate logic: remove gates with the exact same inputs as other gates and redirect their fanout to the duplicate gate. (4) Remove duplicate registers: remove registers with the exact same inputs as other registers and redirect their fanout to the duplicate register.

In an implementation, technology mapping (or tech mapping) is part of synthesis, and generally comes at the end of synthesis. In an alternative implementation, tech mapping may be part of the place and route. Tech mapping converts the netlist into another which matches the logic structure of the target architecture. For example, for programmable logic, tech mapping converts the netlist into a format for the logic blocks, look-up tables, flip-flops, and other logical elements of the programmable logic architecture.

Table A below shows an example of a synthesis script.

TABLE A

1. Minimize logic
    two-level minimizer, odc, remove duplicate logic, DFFs
2. Collapse to remove structure
    Eliminate
3. Minimize & add structure 1
    Two-level minimizer, factor, resynthesize
4. Minimize & add structure 2
    Two-level minimizer, factor, resynthesize
5. Extract duplicates
    Remove duplicate logic, DFFs, extract common cubes Synthesis need not be part of the same system as the other parts of the flow. In particular, any number of separate tools could perform the synthesis operation and then feed the resulting technology-mapped netlist into the middle part of the flow. For example, synthesis tools produced by the Synplicity Corp. of Sunnyvale, Calif. or Mentor Graphics Corp. of Wilsonville, Oreg. produce synthesis tools which directly feed the Quartus CAD tools produced by Altera Corp. of San Jose, Calif. In these cases, one may refer to the first synthesis as arising from a "third party tool" (where the first party is our tool and the traditional second party being the user of the tool). Because the third-party tool provides a netlist which is already synthesized, the first-party tool treats this as a "WYSIWYG" netlist. WYSIWYG stands for "what you see is what you get."

Place and route is a process or method of choosing individual physical locations on a chip, board or other physical hardware implementation for each cell in the netlist, and then performing the connections between them. Placement places cells of the netlist into the target hardware architecture. Routing performs physical wiring connections between cells. For the specific embodiment of programmable logic, this means determine which logic elements (and their look-up tables) implement particular functions and how the signals are routed using the interconnect, global and local.

Timing analysis determines the electrical or other delay and thus the performance or timing of the eventual hardware. For example, timing analysis evaluates the delays between registers and I/Os to determine the potential performance (i.e., speed) of the design. Using timing analysis, a user will have a good estimate as to the performance of his logic implemented in the integrated circuit (e.g., programmable logic). At this point, the design has not been implemented in the device, and the user can change the design as needed to obtain the performance the user desires. For example, if the speed path is not fast enough, the user can make design changes and go though the CAD flow again. Design is sometimes an iterative process, where the user tries a design, sees the results using timing analysis, makes changes to the design, and sees the results again. This process may be repeated many times as needed.

The step of "bitstream generation" is specific to the example of FPGA or PLD devices which are programmed by a bitstream. In particular, the design is converted into a stream of bits that will be loaded into the FPGA or PLD device to configure it to the user's design. This step is optional since it is not needed for certain integrated circuits, such as ASICs (which are hard-programmed using masks or lasers instead of a bitstream).

Each of these steps in the FIG. 5 flow above is commonly broken down into further steps. In an embodiment, the invention is a resynthesis technique and may add additional steps to the flow or may be additional steps within one of the existing steps.

Technology mapping maps into the cells, placement puts the cells into the integrated circuit, and routing connects the cells in the integrated circuit. This will then be physically implemented in an integrated circuit by programming or configuring it.

Further discussion of CAD flows for programmable logic are discussed in U.S. patent application Ser. No. 10/461,921, filed Jun. 12, 2003, U.S. patent application Ser. No. 10/446,650, filed May 27, 2003, which are both incorporated by reference. The techniques of the invention may be applicable, combined with, or both, to the flows and techniques described in these applications.

In an embodiment, the invention is a technology mapping technique of minimizing circuit area on programmable logic or FPGAs with fracturable logic elements (LEs). As discussed briefly above, tech mapping converts the netlist into another which matches the logic structure of the target architecture. For example, for programmable logic, tech mapping converts the netlist into a format for the logic blocks, look-up tables, flip-flops, and other logical elements of the programmable logic architecture.

Figure 6:
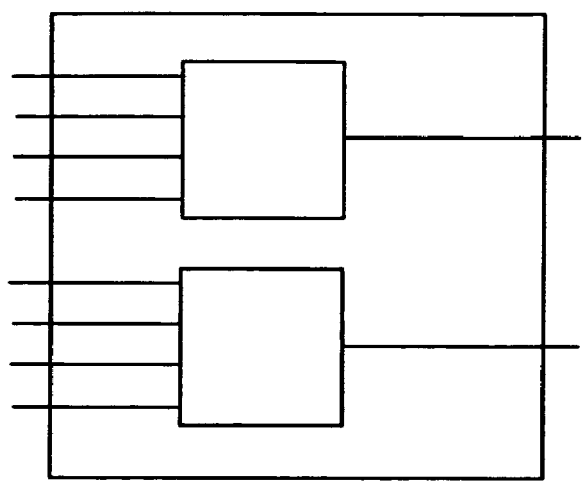
FIG. 6 shows a fracturable logic block configured to implement two four-input look-up tables.
Figure 7:
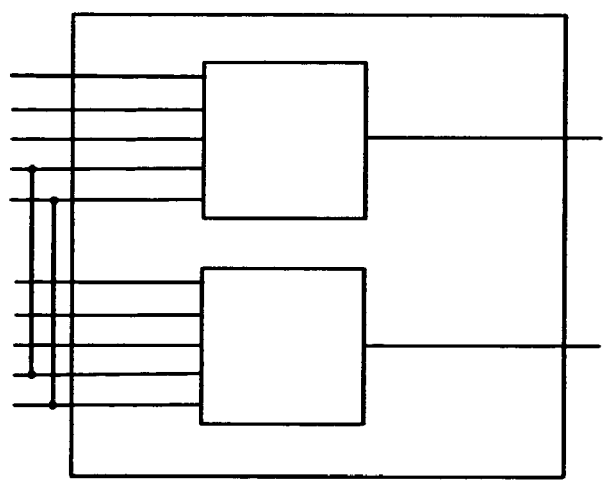
FIG. 7 shows a fracturable logic block configured to implement one eight-input look-up table, with shared inputs.
Figure 8:
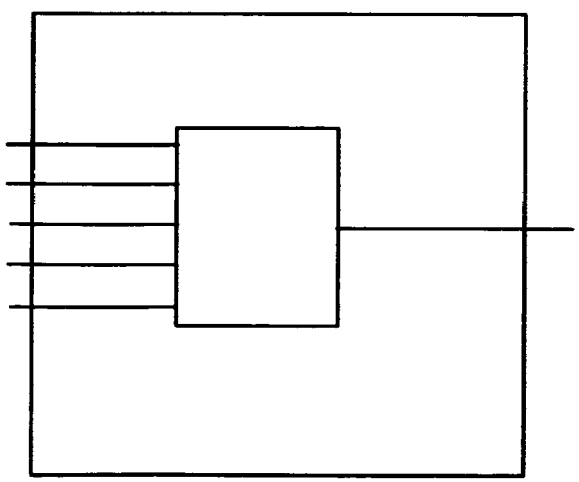
FIG. 8 shows a fracturable logic block configured to implement one six-input look-up table.

A fracturable LE can be used for logic implementation in different ways such as being used as one maximum-sized look-up table (LUT) or multiple smaller LUTs. FIGS. 6, 7, and 8 show a specific example of a fracturable logic element. In FIG. 6, the logic element is configured to implement two four-input look-up tables. In FIG. 7, the logic element is configured to implement one eight-input look-up table, with shared inputs. In FIG. 8, the logic element is configured to implement one six-input look-up table. A fracturable logic element provides greater flexibility and allows for the higher utilization of the on-chip logic. For example, if only eight-input look-up tables are provided when four-input look-up tables are needed, only half of capacity of the eight-input look-up tables will be utilized. Therefore, fracturable look-up tables allow greater utilization and adaptability to the logic design.

FIGS. 6, 7, and 8 show merely an example of a fracturable logic element. There are many possible fracturable logic element configurations, and the invention may be applied to any of these configurations. The logic element may be fractured in any number of portions, inputs, look-up tables, and the like. For example, in another embodiment, a logic element may have one six-input look-up tables or two five-input look-up tables, with shared inputs.

A CAD system should allocate a particular logic design to take advantage of the fracturable logic element or logic block (LB) architecture. For fracturable logic block architecture, the packing of small LUTs into LBs is an important step to achieve minimal area. For example, in a specific embodiment, the logic element implements one six-input look-up table or two five-input look-up tables with shared inputs. A network of three six-input look-up tables actually costs more area than a network of four five-input look-up tables with shared inputs, for the former network requires three logic blocks while the latter requires only two. The conventional objective of minimizing the number of LUTs is no longer valid for fracturable LBs. In an embodiment of this invention, a new technology mapping approach is used to lead to minimal area in term of fracturable LEs.

Previous technology mapping algorithms try to minimize circuit area in term of LUTs without paying attention to fracturable logic block architectures. Due to the packing capability of fracturable LEs, the past algorithms usually lead to larger area in term of logic blocks (instead of LUTs).

Our technique is to maintain a balance between small LUTs and maximum-sized LUTs in the circuit implementation to achieve a minimal area. The balancing technique of the invention leads to a smaller area in term of fracturable logic elements compared with conventional LUT-oriented technology mapping algorithms.

The technique of the invention maintains good balance between the maximum-sized LUTs and smaller LUTs in technology mapping, without sacrificing the network depth. Those large LUTs are used on critical paths to minimize delay while small LUTs are packed into logic blocks to save area. The technique achieves the proper balancing by tuning the weighting coefficients in the cost function. Experimental results show that this technique is effective and obtains smaller area than other approaches.

This patent describes a technique of minimizing circuit area on FPGAs with fracturable logic elements (LEs) by using "balancing" in the technology mapping stage of the FPGA CAD flow. A fracturable LE can be used for logic implementation in many ways, such as being used as one maximum-sized lookup table (LUT) or multiple smaller LUTs. By balancing, we mean that the technology mapping algorithm is tuned to use more small LUTs and fewer maximum-sized LUTs to implement the circuit. Although this is counterintuitive since the larger LUTs are more effective at absorbing gates, the technique achieves a smaller final circuit area by packing small LUTs into fracturable logic elements. The relevant flow and techniques are described below.

FIG. 5 shows a typical CAD flow for an FPGA. Typically within synthesis are two steps, technology mapping and ALE packing (or LE packing). It is the interaction of these two steps that allow the final area to be reduced using this invention.

Technology mapping for FPGAs transforms logic gates into look-up tables (LUTs) where each K-input LUT (K-LUT) can implement one arbitrary function of up to K inputs. There are a few ways to carry out the transformation. One of them is through the LUT covering process where each LUT covers a cone of logic gates and all LUTs together cover the entire network. Some outputs of logic gates are preserved as the LUT outputs while others are absorbed into LUTs. The resulting network is a LUT network.

Technology mapping is usually targeted for minimal area, minimal delay, or a combination of the two. In order to achieve the objective, a cost function is used to evaluate all possible ways of local LUT covering in order to achieve a near optimal LUT network. Two common terms in the cost function are delay estimates at LUT outputs and area estimates of the final LUT network. Depending on the mapping objective, weights are assigned to the cost function terms to differentiate LUT covering processes.

Figure 9:
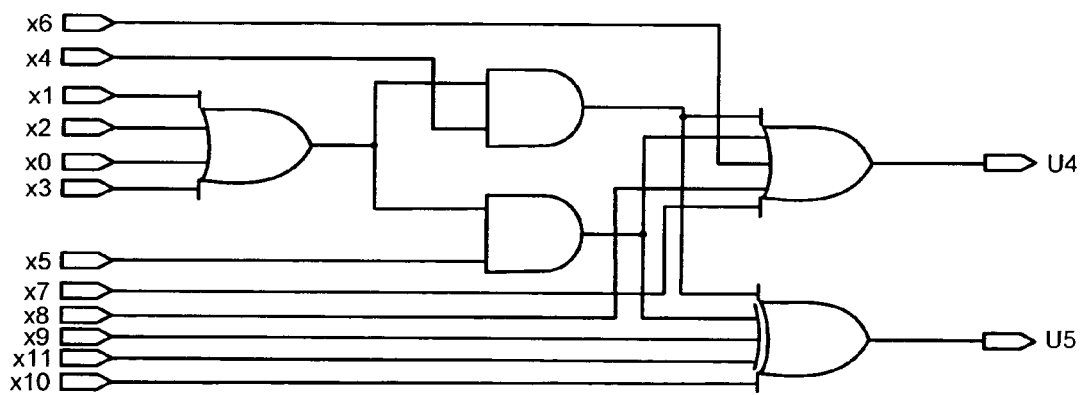
FIG. 9 shows an example of a logic design.

The LUT covering process is demonstrated on the following Verilog design where x0 to x11 are design inputs, U1 to U3 are internal gates, and U4 and U5 are design outputs. The circuit diagram is shown in FIG. 9.

U1=x0|x2|x2|x3
U2=U1 & x4
U3=U1 & x5
U4=U2|U3|x6|x7|x8
U5=U2^U3^x9^x10^x11

The symbol "|" denote OR, "&" denotes AND, and "^" denotes XOR.

Figure 10:
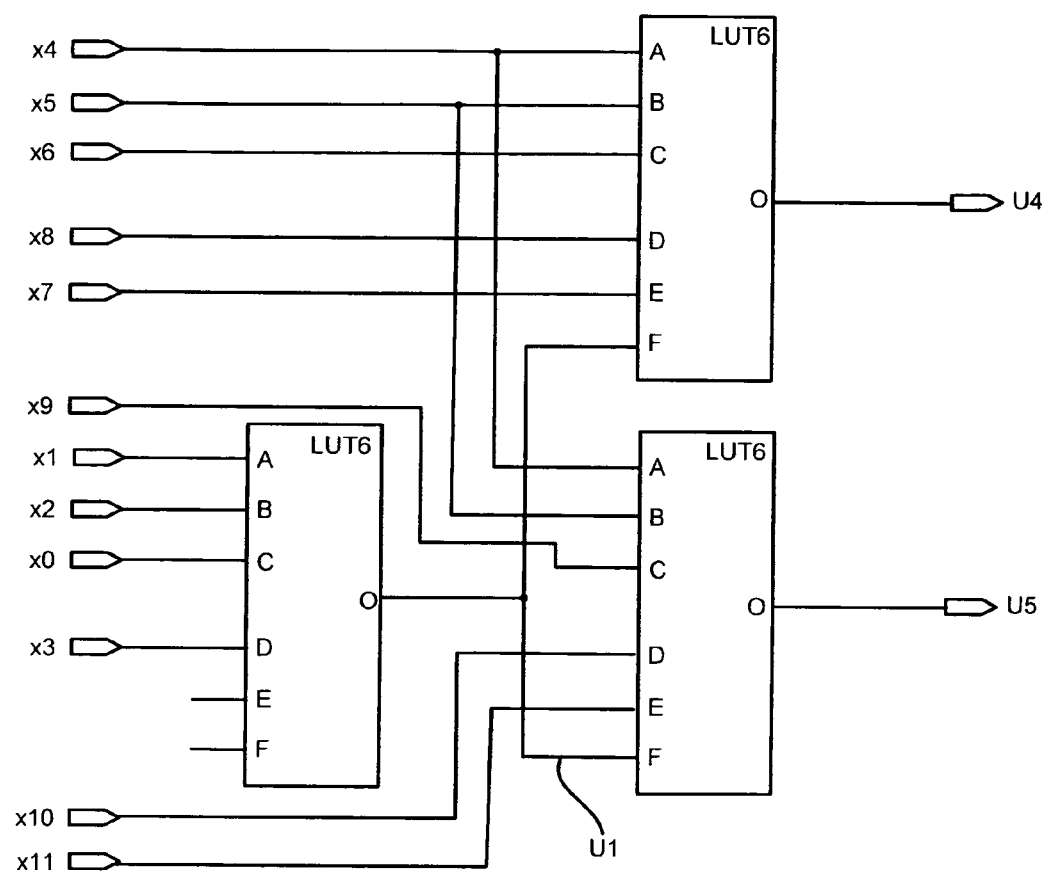
FIG. 10 shows a technology mapping of the logic design of FIG. 9 using six-input look-up tables.

Using 6-LUTs to cover the design, the best possible solution is shown in FIG. 10, which shows a two-level LUT network that consists of a 4-LUT (U1) and two 6-LUTs (U4 and U5). Note that U1 is represented as a 6-LUT with two unused inputs in FIG. 10.

U1=x0|x1|x2|x3
U4=(U1 & x4)|(U1 & x5)|x6|x7|x8
U5=(U1 & x4) ^(U1 & x5) ^x6^x7^x8

In recent years, FPGA logic elements have become more complex than they have been previously. A few LUTs are contained in one logic element to realize a large function or to share inputs among a few small functions. For example, a specific architecture may contain three LUTs fed by nine inputs in total and another specific logic element contains a few LUTs that can be configured for a wide range of logic implementations. These complex logic element architectures require a renovation of existing approaches or development of new algorithms.

Most area-oriented technology mapping algorithms are designed to reduce the number of LUTs in the final LUT network. Previous algorithms such as Chortle-crf, mis-pga, levelmap, and many others do not exploit fracturable logic element architectures. Furthermore, among technology mapping algorithms for delay minimization, one can obtain a LUT network of minimum depth (unit delay model). Another algorithm reduces the number of LUTs while maintaining the minimum depth. However, neither algorithms exploit fracturable logic element architectures.

In many FPGA logic synthesis flows, after technology mapping, an area minimization step is taken that packs multiple LUTs into single complex logic element. For example, following a specific mapping approach, a procedure is called to put a 5-LUT and a 4-LUT in one logic element. In such flows, the outcome of technology mapping could affect the efficiency of LUT packing significantly. However, in these efforts the two steps stay independent of each other.

Instead of mapping to LUTs followed by packing into logic elements, an alternative approach is to transform logic gates to complex logic elements directly. Another technique may be employed to compute area-optimal mapping solutions for arbitrary LUT-based logic element architectures. This approach, however, suffers long runtime and is not applicable to practical larger designs.

The invention described is a method of technology mapping that produces a set of LUTs of different sizes for achieving minimal area on fracturable logic element architectures.

This patent shows an example of the technique being used with respect to a specific logic element architecture, but the technique can easily be adapted to any fracturable logic element architecture. For this example, the fracturable logic element may be configured in three different ways. First, as represented by FIG. 8, it can be used as a 6-LUT, which is a LUT with 6 inputs. Second, as represented by FIG. 7, it can be used as two 5-LUTs sharing two inputs. This LUT configuration has a total of 8 inputs, 3 independent and 2 shared inputs for each of the LUTs. And third, as represented by FIG. 6, it can be used as two independent 4-LUTs, where inputs of the LUTs are not shared. This LUT configuration has a total of 8 inputs, 4 for each of the LUTs.

This fracturable LUT may be referred to as a (6,2) fracturable LUT, where 6 represents the number of inputs for the largest LUT and 2 is the number of shared inputs when breaking the 6-LUT input two LUTs. For a (I, J) fracturable LUT, a maximum number of inputs when the LUT is fractured will be given by I plus J. There are many different combinations of configurations for fracturable LUTs. Some other example of fracturable LUT configurations include (6,3), (5,3), (5,2), (5,1), (4,2), and others. Fracturability of LUTs provides better and more flexible utilization of the programmable logic resources of a programmable logic integrated circuit. For example, a user's function may need fewer inputs than provided by a LUT. Then the LUT may be fractured and another function may be implemented into the other half of the LUT. See FIG. 6 where there are two input LUTs. Or, a user's function may have more inputs than provided by a LUT before being fractured, then after fracturing, the LUT with shared inputs will support more inputs. See FIG. 7.

The software routines used to implement a user's logic into the LUT should make a determination of which configuration the LUT should be used in. Specifically, instead of technology mapping to 6-LUTs as most algorithms do, the technique regulates the mapping to generate mostly 5-input or smaller LUTs so that the fracturable logic element architecture can be exploited in the LUT packing stage for minimal area (number of LEs). A cost function is used to evaluate the possible configurations, and the configuration which has the lowest cost (or highest cost, depending on how the cost function is characterized) is selected.

Figure 11:
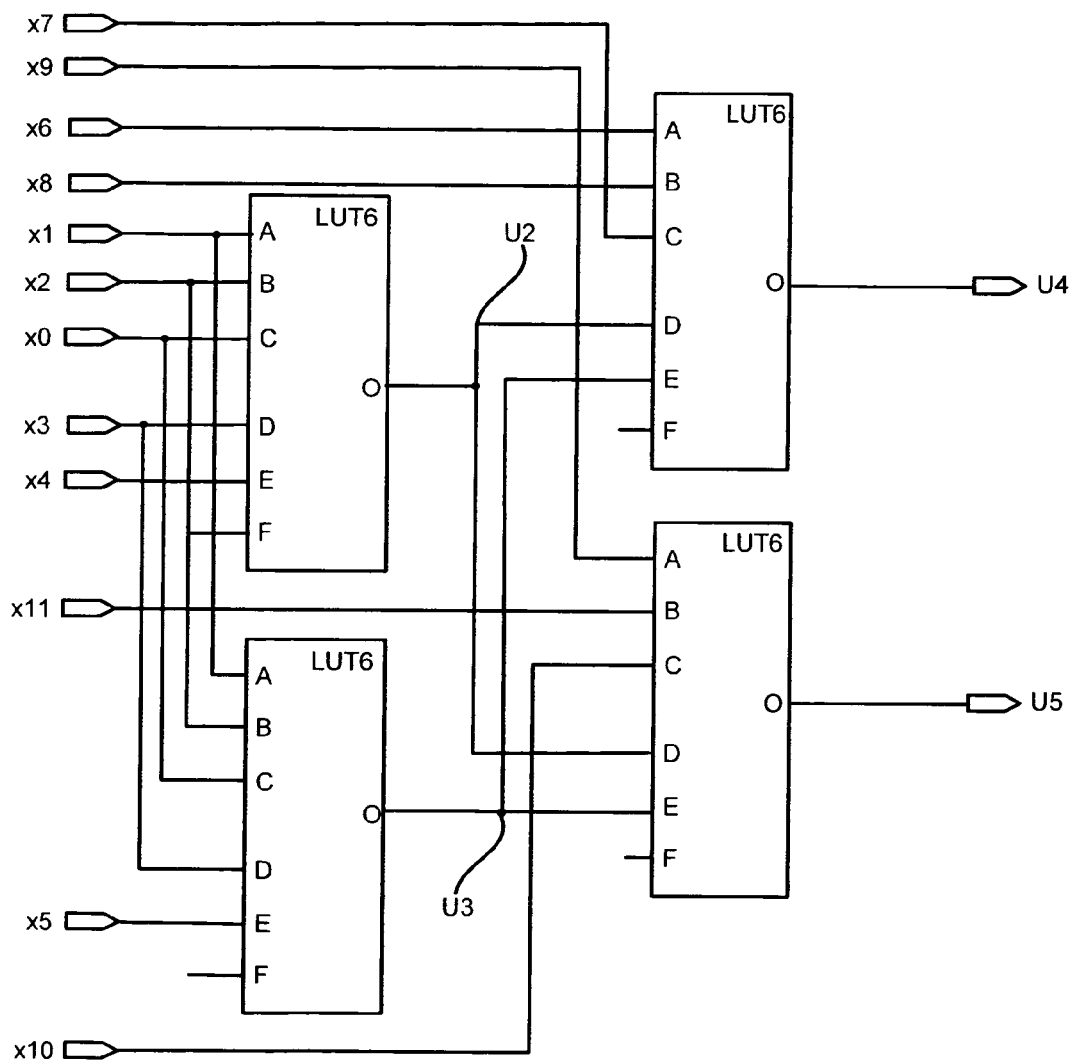
FIG. 11 shows a technology mapping of the logic design of FIG. 9 into fracturable logic elements of programmable logic using five-input look-up tables.

As an example, the method is applied to the design in FIG. 9 to obtain a 2-level LUT network shown in FIG. 11, which contains four 5-LUTs (U2, U3, U4, and U5.) Note that all 5-LUTs are represented as 6-LUTs with one unused input in the diagram. The circuit is described by the following Boolean equations.

U2=(x0|x1 |x2|x3)& x4
U3=(x0|x1|x3) & x5
U4=U2|U3|x6|x7|x8
U5=U2^U3^x9^x10^x11

Compared with the network in FIG. 10, this one may not look as good since it requires four LUTs. But for the this logic element structure, U2 and U3 can be packed into one logic element and U4 and U5 can be packed into another logic element. Therefore, this network requires only two logic elements after packing while the network in FIG. 10 requires three logic elements.

Furthermore, the mapping goal may be achieved by creating a cost function that combines two common cost measures, LUT area impact (A) and sharing possibility (S), with a LUT packing availability (P) term. The term A measures the inevitable area increase from creating a LUT. The term S measures the sharing potential (a merit) of the LUT. And the term P measures the availability for packing with other LUTs. Weighted by three coefficients, denoted as Wa, Ws, and Wp, respectively, the three cost components are integrated into a cost function C as follows.

$$C=Wa*A-Ws*S+Wp*P$$

This is merely an example of a cost function that may be used with the invention. Other cost functions may also be used. The user may select a cost function that best suits the idea of packing into smaller or fractured LUTs when the circuit depth stays the same and the area after packing is reduced. The invention achieves its mapping goal by creating a cost function that combines two common cost measures, LUT area impact (A) and sharing possibility (S), with a LUT packing availability (P) term. The term A measures the inevitable area increase by creating a LUT. The term S measures the sharing potential (a merit) of the LUT. And the term P measures the availability for packing with other LUTs. Weighted by three coefficients, denoted as Wa, Ws, and Wp, respectively, the three cost components are integrated into the cost function C as formulated above.

Figure 12:
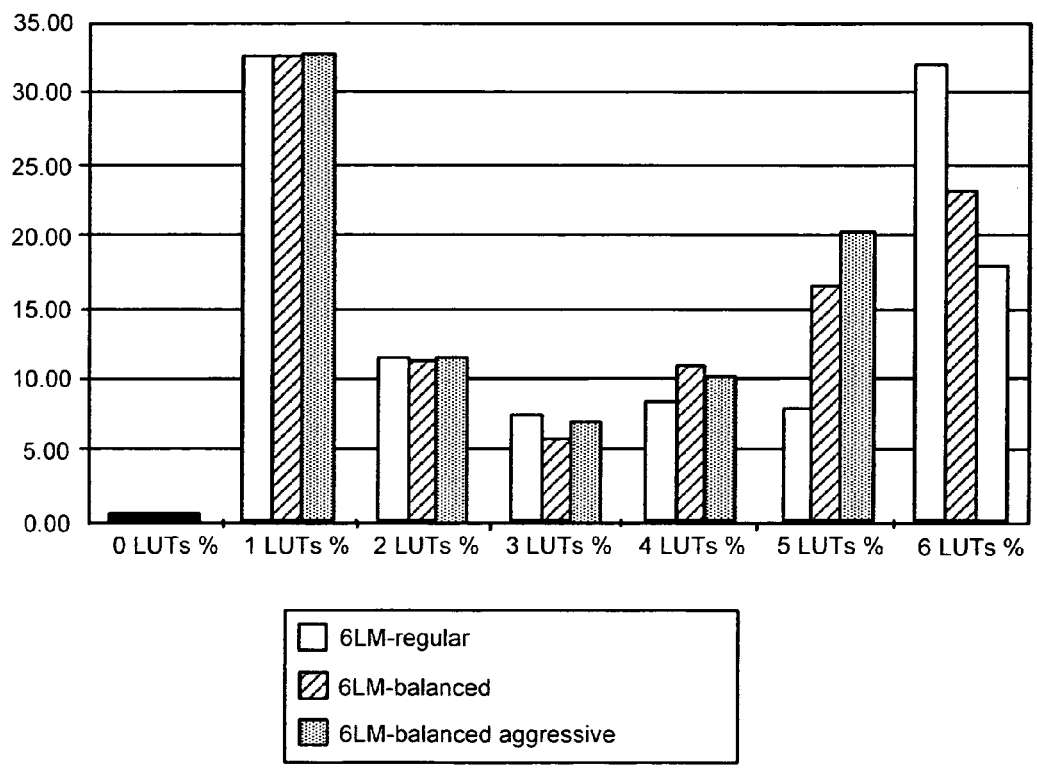
FIG. 12 shows a distribution of look-up tables in three networks obtained by changing a coefficient Wp in the technology mapping.

In a specific mapping implementation, P is set to 1 for 6-LUTs and 0 for smaller LUTs. By adjusting the coefficient Wp, one can regulate the generation of 6-LUTs. When Wp is set to be ½ of Wa, one obtains more small LUTs in this approach than conventional approaches, which eventually leads to a smaller area in terms of LEs. In FIG. 12, there are three different LUT distributions obtained from setting Wp to 0 (regular), ½ Wa (balanced), and 7.5 Wa (aggressive), respectively. The vertical axis represents the percentage of LUTs of each size in the LUT network. One can see that the balancing technique is very effective in regulating the population between 6-LUTs and smaller LUTs.

In a specific embodiment, the W coefficients (Wa, Ws, and Wp) are experimentally tuned. For example, the W coefficients may be selected by applying the technique of the present invention using various Wa, Ws, and Wp values and observing the results. The variable A is a representation of the area cost of a particular LUT and its value depends on architecture. This is a positive value because it increases cost C. For example, a 6-LUT would have a higher cost than at 5-LUT or a 4-LUT. Various values for A may be kept in a data structure such as a look-up table and this look-up table may be referred to during the execution of the technology mapping. For example, when a 4-LUT (i.e., a four-input LUT) is found, the appropriate value for A will be found in this look-up table. A 4-LUT may have a value of 0.25 while a 6-LUT may have a value of 0.55, which is greater than that for a 4-LUT.

The variable S is a representation of fan out. Greater fan out in a design generally improves or enables more input sharing, reducing the number of LUTs that are needed and allows further packing. For example, a 5-LUT can be packed with another 5-LUT if both LUTs share two inputs and not otherwise. Thus, S reduces cost, and therefore, S is a negative value. S is typically determined dynamically for each cone (i.e., tree of gates that terminates in a hard cell) during technology mapping.

The variable P is a representation for packing ability. P reflects the ability of a LUT to pack with other LUTs. A LUT with greater number of inputs generally has higher costs with regard to packing than a LUT with fewer inputs. For example, a 6-LUT generally can be packed less than a 4-LUT, so a 6-LUT will having higher cost, which is reflected in a bigger P. Hence, P is a positive value. Similar to the variable A, P depends on architecture. Various values for P may be kept in a data structure such as a look-up table and this look-up table may be referred to during the execution of the technology mapping. For example, when a 5-LUT (i.e., a five-input LUT) is found, the appropriate value for P will be found in this look-up table. A 5-LUT may have a value of 0.45 while a 6-LUT may have a value of 0.67, which is greater than that for a 5-LUT.

FIG. 12 shows a distribution of LUTs in three networks obtained by changing the coefficient Wp in the technology mapping.

In a first step of a flow, the technique of the invention finds all possible LUTs combination for each gate. In an alternative embodiment, the first step determines a number of possible LUT combinations, not necessarily every combination. Also, LUTs are for specific technology but other technologies may have different types of logic structures, such as multiplexers or product terms, and the principles of the invention may be applied to these other target technologies.

Then in a second or subsequent step, a determination is made for the cost of each combination. This second step makes the determination how the function or logic design will be implemented. As discussed above, the output of each step may be altered or changed by user-selected variables such as Wp and P, which gives the packing possibility. For example, a 6-LUT has higher cost because it cannot be packed as much. Therefore, by selecting the coefficient and variables for the above equation, the mapping can be changed from a more balanced approach to a more aggressive approach.

In the invention's mapping implementation for LEs, P is set to 1 for 6-LUTs and 0 for smaller LUTs. By adjusting the coefficient Wp, one can regulate the generation of 6-LUTs. When setting Wp to be ½ of Wa, one can obtain more small LUTs in this approach than conventional approaches, which eventually leads to a smaller area in term of the LEs. The balancing technique of the invention is very effective in regulating the population between 6-LUTs and smaller LUTs.

It should be noted that all of the above choices are made while the LUT depth of the netlist remains the same. In other words, the technique is able to optimize for area while performance stays unchanged.

This invention may be put to use in a CAD system in a number of ways. One option is to optimize the balancing over a large suite design and pick the best average settings for Wa, Ws, and Wp in the cost function. The other option is to generate a number of technology-mapped versions of the same netlist. Then after LE packing the tool can pick the one with best final area.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method comprising:
   mapping a logical function into a logic block comprising a look-up table structure configurable in a first configuration having a first look-up table having X inputs, or in a second configuration having a second look-up table having Y inputs and a third look-up table having Z inputs, wherein U inputs of the second and third look-up tables are shared, X, Y, Z, and U are integers 1 or greater, X is larger than Y and Z, and a total number of inputs to the second and third look-up tables is X plus U; and
   selecting one of the first configuration or second configuration of the look-up table structure for the logic block based upon a cost function comprising a product Wp*P, where P is a measure of an availability for packing and Wp is a coefficient.

2. The method of claim 1 wherein Wp is a user-selectable value.

3. The method of claim 1 wherein the look-up table structure further comprises a third configuration having a fourth look-up table and fifth look-up table, each having V independent inputs, wherein V is less than X, Y, and Z.

4. The method of claim 1 wherein the cost function comprises Wa*A−Ws*S+Wp*P, where A is a cost measure of look-up table area input and S is a measure of sharing possibility, and Wa and Ws are coefficients.

5. The method of claim 4 wherein Wp is 0 or Wp is ½ of Wa.

6. The method of claim 4 wherein Wp is 7.5*Wa.

7. The method of claim 1 wherein X is 6, Y and Z are 5, and U is 2.

8. A method comprising:
   providing a plurality of logic blocks comprising a look-up table configurable in a first configuration as a look-up table having at most X inputs or in a second configuration as one or more look-up tables, in which at least one of these look-up tables in the second configuration has at most Y inputs, wherein X and Y are integers 1 or greater, and Y is less than X;
   mapping a logic function into one of the plurality of logic blocks, wherein based on a first selected value for a coefficient in a cost function, the logic function is mapped into I look-up tables of the first configuration, wherein I is an integer 1 or greater; and
   mapping a logic function into one of the plurality of logic blocks, wherein based on a second selected value for the coefficient in a cost function, the logic function is mapped into J look-up tables of the second configuration, wherein J is an integer greater than I.

9. The method of claim 8 wherein the cost function comprises Wa*A−Ws*S+Wp*P, where A is a cost measure of look-up table area input, S is a measure of sharing possibility, P is a measure of an availability for packing, and Wa, Ws, and Wp are coefficients.

10. The method of claim 9 wherein Wp is 0, Wp is ½ of Wa, or Wp is 7.5*Wa.

11. The method of claim 9 wherein X is 6 and Y is 5.

12. The method of claim 8 wherein at least one input is shared between a first look-up table and a second look-up table of the second configuration.

13. The method of claim 12 wherein a number of total number of inputs to the J look-up tables in the second configuration is greater than X.

14. A method comprising:

providing a plurality of logic blocks comprising a look-up table configurable in a first configuration having a look-up table with at most X inputs and a second configuration having a plurality of look-up tables, at least one of the look-up tables of the second configuration having at most Y inputs, wherein X and Y are integers 1 or greater, and Y is less than X;

evaluating a cost function to obtain a first cost value when mapping a logic function using a logic block of the first configuration;

evaluating the cost function to obtain a second cost value when mapping the logic function using a logic block of the second configuration; and mapping the logic function to a logic block having the first configuration if the first cost value is less than the second cost value.

15. The method of claim 14 further comprising:

mapping the logic function to a logic block having the second configuration if the second cost value is less than the first cost value.

16. The method of claim 14 wherein for the second configuration of the logic block, at least one of the input to the plurality of look-up tables is shared.

17. The method of claim 14 wherein the cost function comprises a variable representing a packability value.

18. The method of claim 17 wherein the packability value is higher when using the look-up table in the first configuration than when using the look-up tables in the second configuration.

19. The method of claim 14 wherein the cost function comprises a variable representing a fan out value.

20. The method of claim 14 wherein evaluating a cost function to obtain a first cost value comprises:

consulting a look-up table in a database to find a packability value corresponding to a look-up table having X inputs.

21. The method of claim 20 wherein evaluating a cost function to obtain a first cost value further comprises:

consulting a look-up table in a database to find an area value corresponding to a look-up table having X inputs.

22. A computer program product having a computer usable medium having computer readable code embodied therein, the computer program product comprising:

computer readable code configured to cause a computer to effect evaluating a cost function to obtain a first cost value when mapping a logic function using a logic block of a first configuration having a look-up table with at most X inputs wherein X is integer 1 or greater, and;

computer readable code configured to cause a computer to effect evaluating the cost function to obtain a second cost value when mapping the logic function using a logic block of a second configuration having a plurality of look-up tables, one of the look-up tables having at most Y inputs wherein Y is integer 1 or greater, and where Y is less than X; and computer readable code configured to cause a computer to effect mapping the logic function to a logic block having the first configuration if the first cost value is less than the second cost value.

* * * * *